(12) United States Patent
Shin

(10) Patent No.: US 7,144,790 B2
(45) Date of Patent: Dec. 5, 2006

(54) SHALLOW TRENCH ISOLATION TYPE SEMICONDUCTOR DEVICE AND METHOD OF FORMING THE SAME

(75) Inventor: You-Cheol Shin, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 64 days.

(21) Appl. No.: 10/407,115

(22) Filed: Apr. 4, 2003

(65) Prior Publication Data

US 2003/0201511 A1   Oct. 30, 2003

Related U.S. Application Data

(62) Division of application No. 09/819,962, filed on Mar. 28, 2001, now abandoned.

(30) Foreign Application Priority Data

Aug. 29, 2000   (KR) ................. 2000-50419

(51) Int. Cl.
     *H01L 21/762* (2006.01)
(52) U.S. Cl. ............. 438/427; 438/424; 438/294; 438/295; 257/E21.545

(58) Field of Classification Search ........ 438/294, 438/295, 298, 404, 424, 427; 257/E21.545
See application file for complete search history.

(56) References Cited

U.S. PATENT DOCUMENTS

| 5,498,891 | A  | * | 3/1996 | Sato .................... 257/316 |
| 5,646,052 | A  | * | 7/1997 | Lee ..................... 438/426 |
| 6,255,689 | B1 | * | 7/2001 | Lee ..................... 257/314 |
| 6,365,952 | B1 | * | 4/2002 | Akram ................. 257/510 |

* cited by examiner

*Primary Examiner*—N. Drew Richards
(74) *Attorney, Agent, or Firm*—F. Chau & Associates, LLC

(57) ABSTRACT

A shallow trench isolation type semiconductor device is described, which includes a trench having a flexure in a bottom thereof. The flexure has a step difference of about 100 Å or more, and is preferably made at a middle area. Conventionally, a gate insulating layer includes a thin area of about 100 Å or less and a thick area of about 200 Å or more. On the basis of a bottom of a trench peripheral region, a middle part of the flexure may be concave or convex. Particularly, the foregoing device can effectively be applied to a self-aligned flash memory in which a width of a trench between one active region and another is about 3 micrometers or less.

14 Claims, 4 Drawing Sheets

SHALLOW TRENCH ISOLATION TYPE SEMICONDUCTOR DEVICE AND METHOD OF FORMING THE SAME

CROSS-REFERENCE TO RELATED APPLICATION

This application is a divisional of U.S. application Ser. No. 09/819,962 filed on Mar. 28, 2001, now abandoned, the disclosure of which in its entirety is incorporated by reference herein.

BACKGROUND OF THE INVENTION

This application relies for priority upon Korean Patent Application No. 2000-50419, filed on Aug. 29, 2000, the contents of which are herein incorporated by reference in their entirety.

1. Technical Field

The present invention generally relates to a shallow trench isolation type semiconductor device and a method of forming the same. More specifically, the present invention is directed to a shallow trench isolation type semiconductor device in which insulating layers differ in thickness according to regions, and a method of forming the same.

2. Discussion of Related Art

A common problem encountered in device isolation in a high-density semiconductor device is a bird's beak effect, which occurs due to a lateral growth of thermal silicon dioxide in the form of a bird's beak under a $SiN_4$ protective layer. The bird's beak is undesirable since it takes up needed area and has electrical field effects that permit current leakage. A shallow trench isolation (STI) technique for device isolation has been widely used and avoids the problem of the bird's beak effect. However, to achieve superior device isolation results, the depth and width of a trench must be increased. Since it is desirable to have semiconductor devices having small footprints for higher integration, the depth must be increased while the width for insulation must be decreased. In a less than ideal scenario, a deep trench cannot be formed due to the decrease in the width.

When a high voltage is applied, the component at which a high voltage is applied must have a structure that is able to withstand the high voltage. Typically, a gate insulating layer formed at the part where the high voltage is applied is made thicker than the gate insulating layer formed at others.

FIG. 1 is an exemplary cross-sectional view showing the difference in thickness of a gate insulating layer at a low voltage part of cell and peripheral regions compared to a gate insulating layer at a high voltage part of the peripheral region. FIG. 1 also shows an exemplary formation of a self-aligned trench in each region of a flash memory device in which the gate insulating layers differ in thickness. At the peripheral region where the gate insulating layer 13 is thickly formed, a trench 17 for device isolation is shallowly formed, which increases the probability that insulation for device isolation will not be sufficient.

FIG. 1 includes gate insulating layers 11 and 13 which differ in thickness according to each region of a substrate 10. Conventionally, the thickness of the gate insulating layer 11 formed at a low voltage part of cell and peripheral regions is about 70 Å to about 80 Å and the thickness of the gate insulating layer 13 formed at a high voltage part of the peripheral region is about 250 Å to about 350 Å. A polysilicon layer 15 for forming a part of a self-aligned floating gate is stacked on the gate insulating layers 11 and 13. Based upon the STI technique, device isolation is then carried out.

In other words, an etch-stop layer made of silicon nitride is deposited. Preferably, a high temperature oxide (HTO) layer is then deposited for patterning the etch-stop layer, and an anti-reflection coating (ARC) layer is additionally deposited.

Through photoresist coating, exposure using a device isolation mask pattern, and development, a trench pattern for device isolation is formed. Subsequently, upper layers are sequentially etched to be removed. A patterned upper layer can serve as an etching mask to a lower layer. Generally, the etch-stop layer is patterned and the photoresist pattern is removed by ashing and stripping techniques. The polysilicon layer 15, the gate insulating layers 11 and 13, and the substrate silicon layer 10 are etched to form a trench. In the etching process to form the trench, separately etching the gate insulating layer and the substrate causes problems due to shifting of the etching apparatus. Thus, the process is carried-out in one etching apparatus (i.e., "in-situ"). It takes a great deal of time to etch a gate insulating layer at a part where the gate insulating layer is thickly formed. With a conventional silicon oxide layer and silicon etchant for forming a trench, a depth difference (A) of about 180 Å to about 500 Å is observed in a substrate trench where the gate insulating layer is thickly formed. Naturally, the depth difference (A) varies according to the type of etchant used.

Preferably, after thinly stacking a sidewall oxide layer and a silicon nitride liner, the trench is filled with a CVD oxide layer. To complete the trench isolation layer 17, a chemical mechanical planarization (CMP) process for removing the stacked CVD oxide layer on a region except the trench, a wet etching process to remove an etch-stop layer made of silicon nitride, and a cleaning process are then performed. However, where the gate insulation layer is thickly formed, a thickness of the isolation layer 17 has a depth difference (A) as great as a depth of the trench. This is disadvantageous, since if the isolation layer 17 becomes thin at a transistor peripheral region to which a high voltage is applied, device isolation can be incomplete.

Therefore, a need exists for a shallow trench isolation type semiconductor device and a method of forming the same, which can complement a trench isolation layer whose thickness in a silicon substrate is not sufficient. A need also exists for a shallow trench isolation type semiconductor device and a method of forming the same which can complement incomplete device isolation caused by a trench isolation layer whose thickness in a silicon substrate is not sufficient in certain regions due to a thicker gate insulating layer. Additionally, a need exists for a shallow trench isolation type semiconductor device and a method of forming the same which can complement a device isolation layer whose thickness is not sufficient without causing an aligning problem.

SUMMARY OF THE INVENTION

According to an aspect of the present invention, a shallow trench isolation type semiconductor device is provided wherein a flexure with a step difference is made at a bottom of a trench. Specifically, a shallow trench isolation type semiconductor device is provided including at least two regions where gate insulating layers differ in thickness; and a silicon substrate with at least one flexure trench having a step difference.

At least in a partial region of the semiconductor device, a gate insulating layer is deposited at a thickness of about 200 Å or more. Conventionally, the gate insulating layer has a thin region of about 100 Å or less and a thick region of about 200 Å or more. If a step difference of the gate insulating layer is about 100 Å, the step difference of about 100 Å will remain in an etching process without an etching selectivity with respect to a silicon oxide layer and a silicon layer. The step difference can be expanded to, for example, about 500 Å.

Even though it is preferable that the flexure is made in a middle area between active and inactive regions, the flexure may lean toward the active region. At a bottom of a trench peripheral area, the flexure may be concave and convex. In addition, a plurality of flexures may be made therein.

A typical example of an aspect of the present invention can be shown in a flash memory that has a thick gate oxide layer of about 300 Å or more in a peripheral region, and a thin gate oxide layer of about 80 Å or less in a low voltage part of cell and peripheral regions. Particularly, the typical example is shown in a self-aligned flash memory wherein a polysilicon layer to form a part of a floating gate and a trench etching mask are sequentially deposited on a gate insulating layer. The present invention is particularly effective in cases where a width of a trench between one active region and another is 3 micrometers or less at a region having a thick gate oxide layer.

A method according to the present invention includes the steps of making a flexure to have a gate oxide layer whose thickness is different from that of an adjacent gate oxide layer, forming an etching mask pattern to expose the gate oxide layer at a trench area including the flexure, and anisotropically etching the gate oxide layer and a silicon substrate to form a trench.

Specifically, a method of forming a shallow trench isolation type semiconductor device according to an aspect of the present invention comprises the steps of: forming a gate oxide layer, so that a flexure is different from adjacent parts in thickness, the flexure being a part of a trench area on a substrate; forming an etching mask pattern to expose the gate oxide layer in the trench area; and anisotropically and sequentially etching the gate oxide layer and a silicon substrate to form a trench, the gate oxide layer being located on the substrate where the etching mask pattern is formed.

The step of anisotropically etching the gate oxide layer and the silicon substrate comprises two steps: etching the gate oxide layer to expose the silicon substrate on the basis of a thin or thick gate oxide area, and etching the silicon substrate. In at least one of the two steps, an etchant having a low etching selectivity is used. To completely remove the gate oxide layer at a thick gate oxide area, the silicon substrate is etched in a thin gate oxide area as much as a predetermined thickness according to a kind of etchant. Alternatively, one etchant is used in the two steps.

These and other aspects, features, and advantages of the present invention will be described or become apparent from the following detailed description of preferred embodiments, which is to be read in connection with the accompanying drawings.

DETAILED DESCRIPTION OF PREFERRED EMBODIMENTS

A system according to the present invention provides a new and improved shallow trench isolation type semiconductor device and a method of forming the same. In particular, a shallow trench isolation type semiconductor device according to the present invention solves the problem of incomplete device isolation caused by a trench isolation layer whose thickness in a silicon substrate is not sufficient due to a thick gate insulating layer.

Figure 1:
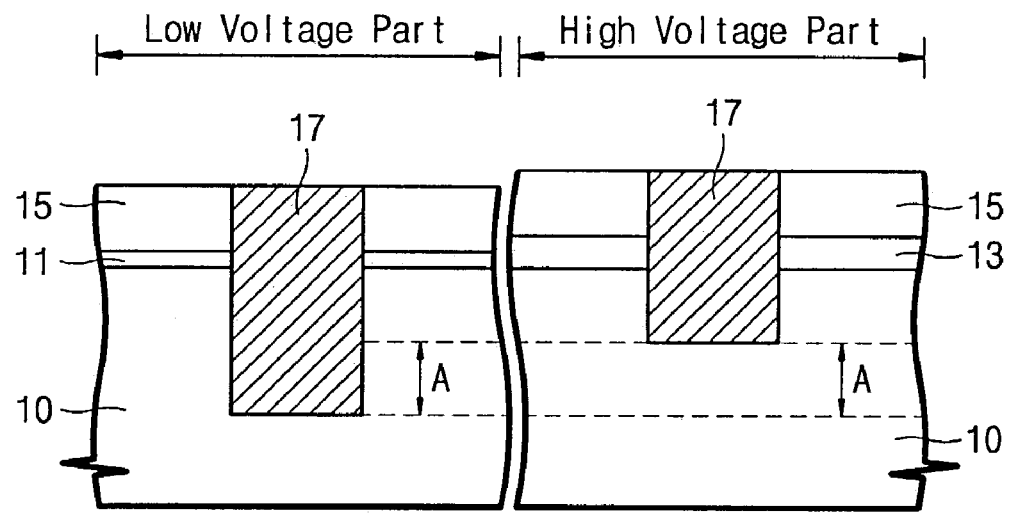
FIG. 1 is an exemplary cross-sectional view showing the difference in thickness of a gate insulating layer at a low voltage part of cell and peripheral regions compared to a gate insulating layer at a high voltage part of the peripheral region.
Figure 2:
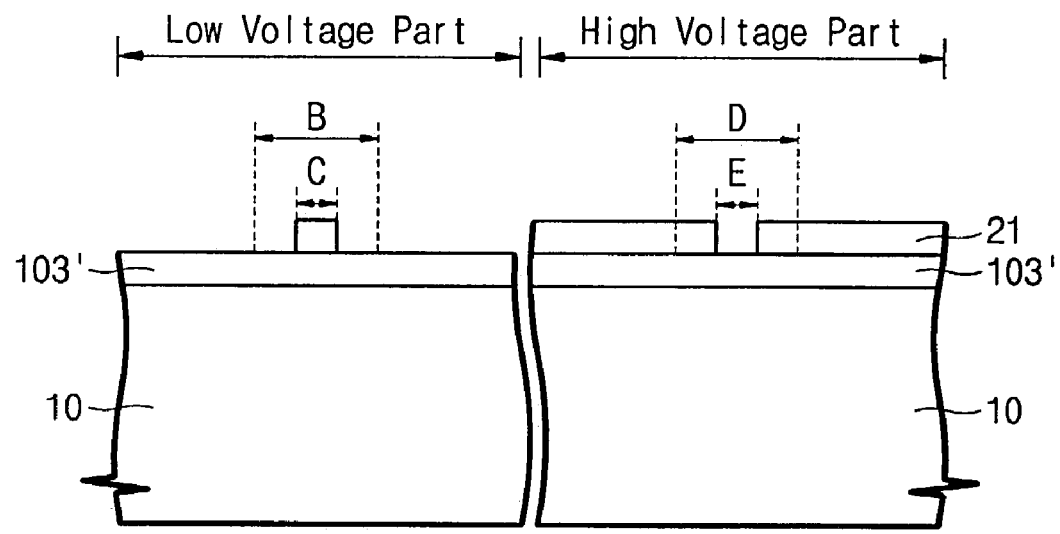
FIG. 2 is an exemplary cross-sectional view showing a step of performing self-aligned trench device isolation at a low voltage part in cell and peripheral regions and a high voltage part of the peripheral region during the formation of a NAND-type flash memory according to an aspect of the present invention, wherein gate insulating layers that differ in thickness are formed.

FIG. 2 is an exemplary cross-sectional view showing a step of performing self-aligned trench device isolation at a low voltage part in cell and peripheral regions and a high voltage part of the peripheral region during the formation of a NAND-type flash memory according to an aspect of the present invention, wherein gate insulating layers that differ in thickness are formed. Referring to FIG. 2, on a substrate 10, a thick gate oxide layer 103 is formed to a thickness of about 300 Å. To form gate insulating layers that differ in thickness at each region, a photoresist pattern 21 is formed which exposes a region (such as a low voltage part of cell and peripheral regions) where a thin gate oxide layer will be formed. In the low voltage part of the cell and peripheral regions excluding the regions where the trench is formed, photoresist remains on a middle area (C) of a trench width (B). In the high voltage part of the peripheral region to which a high voltage is applied, the photoresist is removed on a middle area (E) of a trench width (D).

For alignment convenience, it is preferable that a width of a middle area (C) or (E) is about less than half that of a width of a trench which is to be formed later. For example, if the trench width is about 1.6 micrometers, a suitable value for patterning is about 0.3 to about 0.8 micrometers. To make a flexure in the middle area enhances an alignment margin. For example, in a transistor to which a high voltage is applied, if a concave flexure is made at a part that is bounded on an active region that must endure a high voltage, a gate insulating layer is thinly formed on the active region in case of misalignment. Thus, insulation breakdown may occur.

Figure 3:
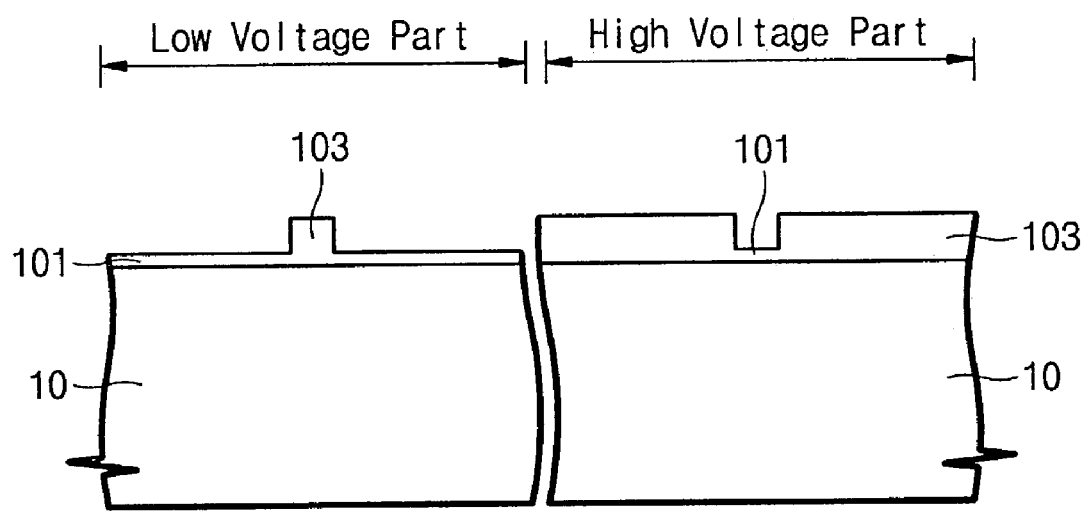
FIG. 3 is an exemplary cross-sectional view showing a step of performing self-aligned trench device isolation at a low voltage part in cell and peripheral regions and a high voltage part of the peripheral region during the formation of a NAND-type flash memory according to an aspect of the present invention, wherein the gate insulating layers are etched.

FIG. 3 is an exemplary cross-sectional view showing a step of performing self-aligned trench device isolation at a low voltage part in cell and peripheral regions and a high voltage part of the peripheral region during the formation of a NAND-type flash memory according to an aspect of the present invention, wherein the gate insulating layers are etched.

Referring to FIG. 3, using the photoresist pattern 21 shown in FIG. 2 as an etching mask, a thin gate oxide layer 103' is etched. Therefore, in a low voltage area of cell and peripheral regions, a gate insulating layer remains only at a middle area of a trench. On the contrary, in a peripheral high voltage area to which a high voltage is applied, the gate insulating layer is removed only at a middle area. The photoresist pattern 21 is then removed using ashing and stripping techniques. Conventionally, after a cleaning process, a thin gate insulating layer 101 is formed in a region where a substrate silicon layer undergoes exposure. The gate insulating layer 101 is a thermal oxide layer that is formed to a thickness of about 80 Å. A part of the substrate is additionally oxidized in a region where a thick gate insulating layer remains, so that a thick gate insulating layer 103 has a thickness of about 350 Å.

Figure 4:
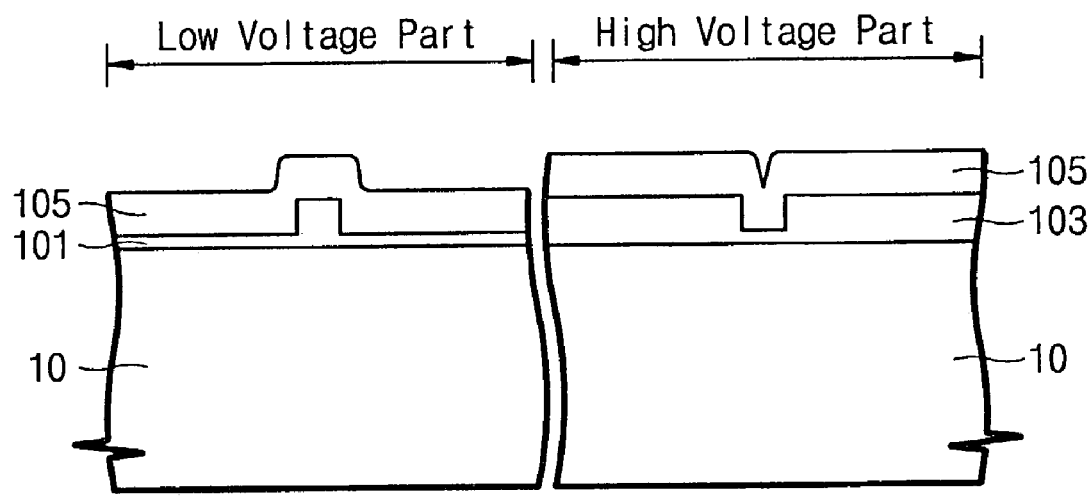
FIG. 4 is an exemplary cross-sectional view showing a step of performing self-aligned trench device isolation at a low voltage part in cell and peripheral regions and a high voltage part of the peripheral region during the formation of a NAND-type flash memory according to an aspect of the present invention, wherein a polysilicon layer is stacked along thin and thick regions of the gate insulating layers.

FIG. 4 is an exemplary cross-sectional showing a step of performing self-aligned trench device isolation at a low voltage part in cell and peripheral regions and a high voltage part of the peripheral region during the formation of a NAND-type flash memory view according to an aspect of the present invention, wherein a polysilicon layer is stacked along thin and thick regions of the gate insulating layers.

Referring to FIG. 4, by a self-aligned process, a polysilicon layer 105 is stacked on an entire surface of a substrate 10 where a thin gate insulating layer 101 and a thick gate insulating layer 103 are formed. A thickness of the polysilicon layer 105 is about 300 Å to about 1000 Å; preferably about 500 Å. The polysilicon layer 105 is preferably conformally stacked along thin and thick regions of the gate insulating layers.

Figure 5:
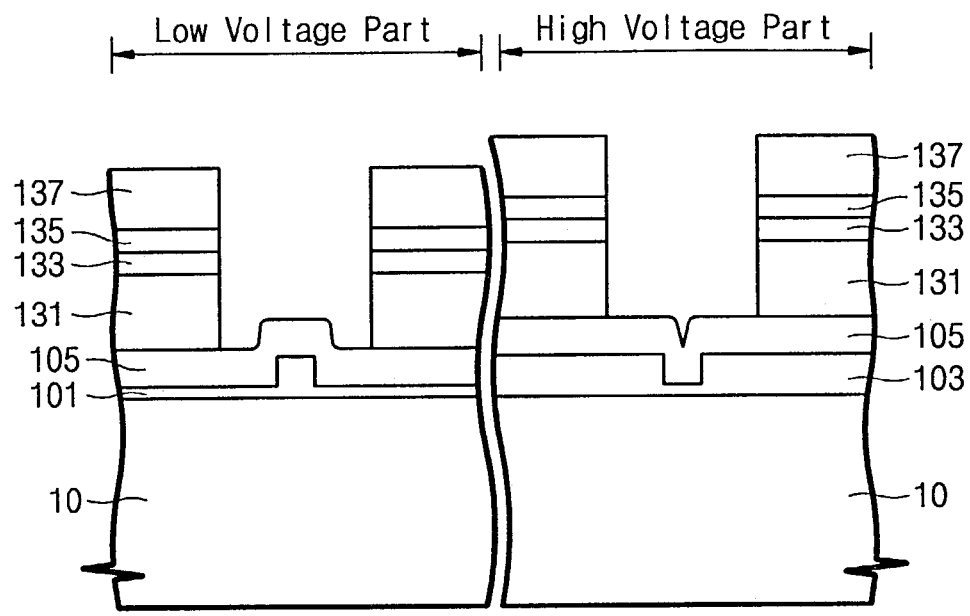
FIG. 5 is an exemplary cross-sectional view showing a step of performing self-aligned trench device isolation at a low voltage part in cell and peripheral regions and a high voltage part of the peripheral region during the formation of a NAND-type flash memory according to an aspect of the present invention, wherein an etch-stop layer, an oxide layer and an anti-reflection coating layer are preferably sequentially deposited on the polysilicon layers.

FIG. 5 is an exemplary cross-sectional view showing a step of performing self-aligned trench device isolation at a low voltage part in cell and peripheral regions and a high voltage part of the peripheral region during the formation of a NAND-type flash memory according to an aspect of the present invention, wherein an etch-stop layer, an oxide layer and an anti-reflection coating layer are preferably sequentially deposited on the polysilicon layers.

Referring to FIG. 5, an etch-stop layer 131, an oxide layer 133 of high temperature, and an anti-reflection coating (ARC) layer 135 are preferably sequentially deposited on a polysilicon layer 105. Using a conventional exposure process, a photoresist pattern 137 is formed to expose a trench area. Using the photoresist pattern 137 as an etching mask, the ARC layer 135, the oxide layer 133, and the etch-stop layer are preferably sequentially etched to form a pattern thereof.

Figure 6:
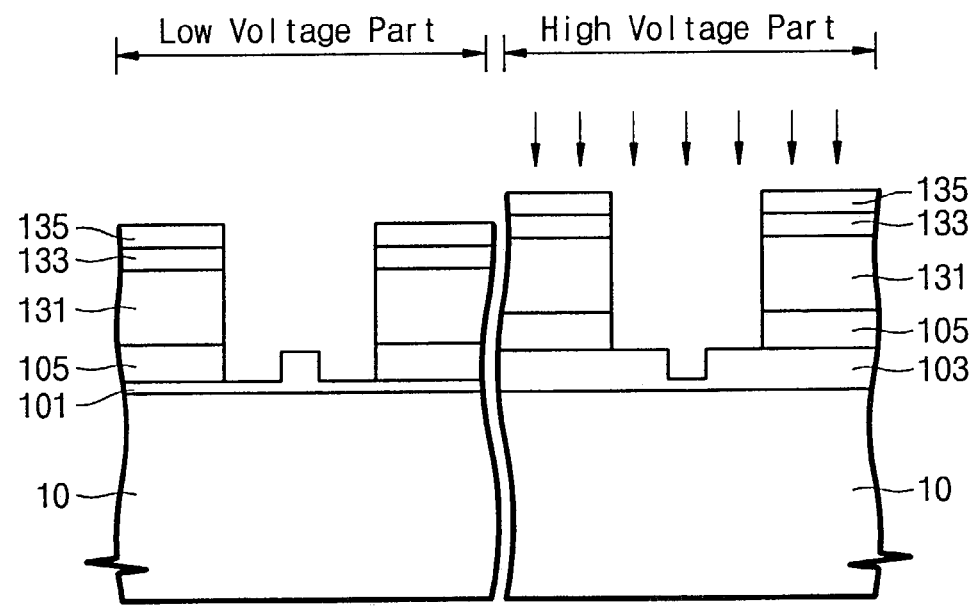
FIG. 6 is an exemplary cross-sectional view showing a step of performing self-aligned trench device isolation at a low voltage part in cell and peripheral regions and a high voltage part of the peripheral region during the formation of a NAND-type flash memory according to an aspect of the present invention, wherein a photoresist pattern is removed.

FIG. 6 is an exemplary cross-sectional view showing a step of performing self-aligned trench device isolation at a low voltage part in cell and peripheral regions and a high voltage part of the peripheral region during the formation of a NAND-type flash memory according to an aspect of the present invention, wherein a photoresist pattern is removed.

Referring to FIG. 6, the photoresist pattern 137 is removed using ashing and stripping techniques. Using patterns of an etch-stop layer 131, an oxide layer 133 of high temperature, and an ARC layer as an etching mask, the polysilicon layer 105 is etched to expose gate insulating layers 101 and 103 that each have a flexure in a trench area. That is, a gate insulating layer having a concave flexure is formed in a trench area of a high voltage part of a peripheral region, and a gate insulating layer having a convex flexure is formed in a trench area of a low voltage part of cell and peripheral regions.

In the step of FIG. 6, it is preferable to perform an ion implantation process for device isolation. In the ion implantation process, impurity ions opposite to substrate ions are complementarily implanted to prevent electrical leakage caused by PN junction at a lower part of a trench. The process is performed not to an entire surface of a substrate, but to a trench area of a high voltage part of a peripheral region or a middle area of the trench. In place of a conventional ion implantation mask for device isolation at a high voltage part of a peripheral region, an ion implantation mask is formed of photoresist in the step of FIG. 6. Then, a trench area of the high voltage part opens up and ion implantation for device isolation is performed.

Figure 7:
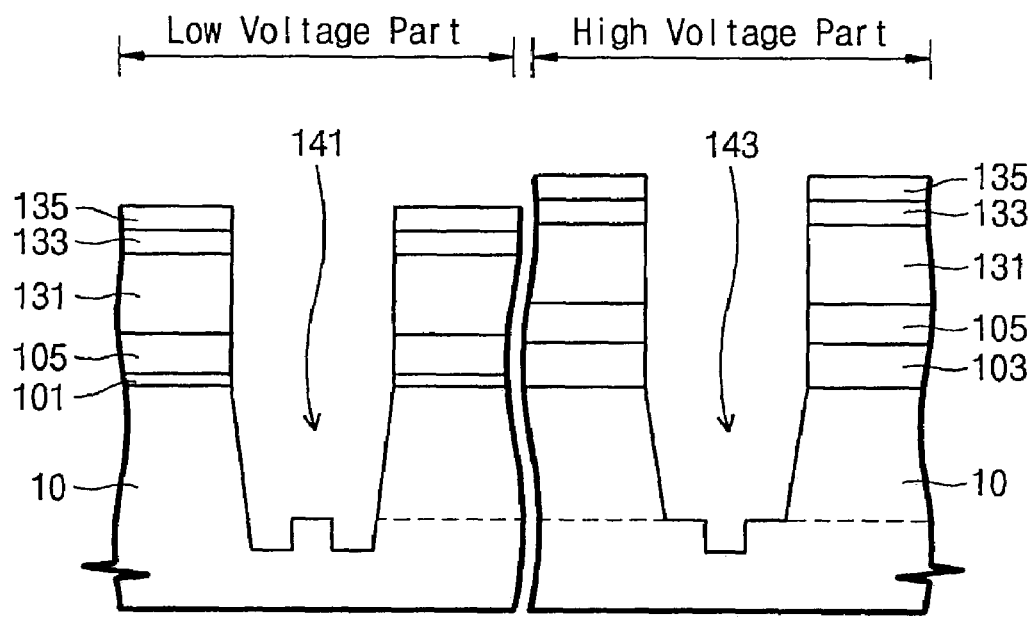
FIG. 7 is an exemplary cross-sectional view showing a step of performing self-aligned trench device isolation at a low voltage part in cell and peripheral regions and a high voltage part of the peripheral region during the formation of a NAND-type flash memory according to an aspect of the present invention, wherein the gate insulating layers and a silicon substrate are preferably sequentially etched.

FIG. 7 is an exemplary cross-sectional view showing a step of performing self-aligned trench device isolation at a low voltage part in cell and peripheral regions and a high voltage part of the peripheral region during the formation of a NAND-type flash memory according to an aspect of the present invention, wherein the gate insulating layers and a silicon substrate are preferably sequentially etched.

Referring to FIG. 7, gate insulating layers and the silicon substrate are sequentially etched. Preferably, the process of etching the thick gate insulating layer 103 and a layer of the silicon substrate 10 are sequentially performed. At the thin gate insulating layer 101, the thin gate insulating layer 101 is completely removed and, in the process of removing the insulating layer, the silicon substrate is etched to a depth of about 500 Å. Then, the silicon substrate is additionally etched about 2000 Å to about 2500 Å. From the part where a thin gate insulating layer is formed, trenches 141 and 143 are formed having a depth about 2500 Å to about 3000 Å. Since the trench 143 in the peripheral region is wider than the trench 141, the depth of the trench 143 may be greater due to a Loading Effect, in which an etching rate is increased when a pattern density is decreased.

In the peripheral region to which a high voltage is applied, a middle part of the trench width has the same depth in the silicon substrate as the low voltage part of the peripheral region. It is found that a path a charge carrier must pass to cause an electrical leakage between devices is identical to that in the case of a deep trench without a flexure at the bottom thereof. On the other hand, a trench in the low voltage part of the cell and peripheral regions also has a convex flexure at the bottom of the trench. Accordingly, compared with a deep trench without a flexure, the trench of the low voltage part has an effect to make the path of electrical leakage two times longer than a flexure step difference. That is, an effect of the shallow trench isolation is enhanced. For example, in a flash memory device, given a same trench depth in a low voltage part and a high voltage part of the cell, a trench depth in a low voltage part of the cell and peripheral regions is relatively sufficient for device isolation compared with the trench depth in a high voltage part of the peripheral region. Accordingly, although it is not necessary to apply a trench having a middle concave flexure in a low voltage part of the cell and peripheral regions, applying such a trench is preferable since device isolation is enhanced.

Subsequently, the following STI processes are conventionally performed. In other words, a thermal oxide layer of a sidewall and a nitride liner are formed. The trench is then filled with a CVD oxide layer. Remaining CVD oxide layer is removed using a CMP technique. Generally, an oxide layer of high temperature is also removed. Additionally, an etch-stop layer pattern used as an etching mask is removed as well using a wet etching process.

As explained above, when a trench lacks sufficient depth in shallow trench isolation, a depth of the trench can be lengthened in a middle area thereof according to an aspect of the present invention. Therefore, it is possible to enhance shallow trench isolation.

Figure 8:
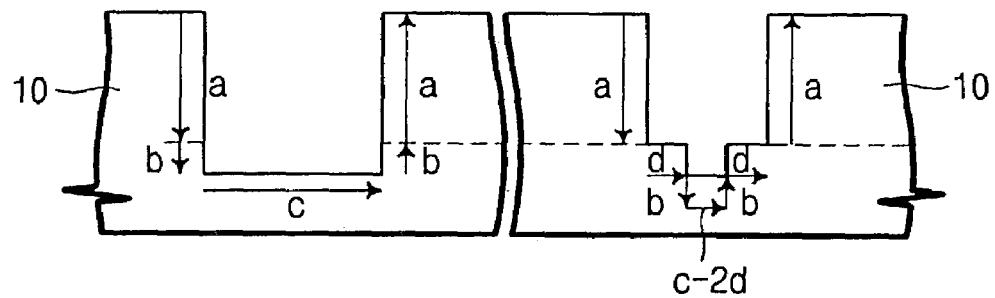
FIG. 8 depicts exemplary cross-sectional views comparing a deep trench without a flexure, and a trench with a flexure made at a bottom thereof according to an aspect of the present invention.

FIG. 8 depicts exemplary cross-sectional views comparing a deep trench without a flexure 800, and a trench with a flexure made at a bottom thereof 805 according to an aspect of the present invention. FIG. 8 illustrates the fact that there is no distance difference of a leakage path in a deep trench without a flexure and another trench with a flexure made at a bottom thereof, even though a width of the trench 805 is less than a width of the trench 800.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the present invention. All such changes and modifications are intended to be included within the scope of the invention as defined by the appended claims.

What is claimed is:

1. A method of forming a shallow trench isolation type semiconductor device comprising the steps of:
   forming a gate oxide layer on a silicon substrate, which has a first step structure;
   forming a polysilicon layer over the gate oxide layer;
   forming an etching mask pattern having an opening aligned with the first step structure; and
   etching the polysilicon layer, the gate oxide layer and the silicon substrate using the etching mask pattern to form a first trench into the silicon substrate having the first step structure formed entirely on a bottom of the first trench.

2. The method of claim 1, wherein the step of etching the gate oxide layer and the silicon substrate is performed anisotropically and sequentially.

3. The method of claim 1, wherein the semiconductor device is a flash memory.

4. The method of claim 1, further comprising forming a second trench having a second step structure formed entirely on a bottom of the second trench.

5. The method of claim 4, wherein a step difference between the first step structure and the second step structure is substantially identical to a thickness difference between the first trench and the second trench.

6. The method of claim 4, wherein the first trench is formed in a high voltage area and the second trench is formed in a low voltage area.

7. A method of forming a shallow trench isolation type semiconductor device comprising the steps of:
   forming a gate oxide layer on a silicon substrate, which has a first step structure and a second step structure;
   forming an etching mask pattern having a first opening aligned with the first step structure and a second opening aligned with the second step structure; and
   etching the gate oxide layer and the silicon substrate to form a first trench in the silicon substrate having the first step structure formed entirely on a bottom of the first trench, and a second trench in the silicon substrate having the second step structure formed entirely on a bottom of the second trench,
   wherein a step difference between the first step structure and the second step structure is substantially identical to a thickness difference between the first trench and the second trench.

8. The method of claim 7, wherein the step of etching is performed anisotropically and sequentially.

9. The method of claim 7, wherein the semiconductor device is a flash memory.

10. The method of claim 7, wherein the first trench is formed in a high voltage area and the second trench is formed in a low voltage area.

11. A method of forming a shallow trench isolation type semiconductor device comprising:
    forming a first oxide layer having a protrusion and a second oxide layer having a recess respectively in first and second regions of a semiconductor substrate;
    forming an etching mask pattern having a first opening and a second opening, the first opening exposing the protrusion of the first oxide layer and a portion of the first oxide layer on both sides of the protrusion, the second opening exposing the recess of the second oxide layer and a portion of the second oxide layer on both sides of the recess; and
    etching the first oxide layer, the second oxide layer and the semiconductor substrate to form a first trench corresponding to the first opening and a second trench corresponding to the second opening, wherein a bottom of the first trench has a protrusion in the central part thereof and a bottom of the second trench has a recess in the central part thereof.

12. The method of claim 11, wherein forming a first oxide layer having a protrusion and a second oxide layer having a recess respectively in first and second regions of a semiconductor substrate comprising:
    forming an oxide layer on the semiconductor substrate;
    forming a photoresist pattern on the oxide layer in the first region and in the second region, the photoresist pattern in the first region covering a portion of the oxide layer corresponding to the protrusion of the first oxide layer, and the photoresist pattern in the second region exposing a portion of the oxide layer corresponding to the recess of the second oxide layer;
    etching the gate oxide layer in the first and second regions exposed by the photoresist pattern; and performing a thermal oxidation to form the first oxide layer in the first region.

13. The method of claim 11, further comprising a polysilicon layer on the first and second oxide layers, and wherein etching the first oxide, the second oxide and the semiconductor substrate comprises etching the polysilicon layer.

14. The method of claim 11, wherein the semiconductor device is a flash memory.

* * * * *